(12) United States Patent
Mazumder et al.

(10) Patent No.: US 10,148,269 B1
(45) Date of Patent: Dec. 4, 2018

(54) DYNAMIC TERMINATION EDGE CONTROL

(71) Applicant: Micron Technology, Inc., Boise, ID (US)

(72) Inventors: Kallol Mazumder, Plano, TX (US); Myung-Ho Bae, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/658,276

(22) Filed: Jul. 24, 2017

(51) Int. Cl.
| H03K 19/00 | (2006.01) |
| H03K 3/037 | (2006.01) |
| H03K 19/20 | (2006.01) |
| G11C 11/4076 | (2006.01) |
| G11C 11/408 | (2006.01) |
| G11C 11/4096 | (2006.01) |

(52) U.S. Cl.
CPC ...... H03K 19/0005 (2013.01); G11C 11/4076 (2013.01); G11C 11/4087 (2013.01); G11C 11/4096 (2013.01); H03K 3/037 (2013.01); H03K 19/20 (2013.01)

(58) Field of Classification Search
CPC ........ G11C 7/1006; G11C 7/22; G11C 7/1051
USPC .................................................... 365/189.12
See application file for complete search history.

(56) References Cited

U.S. PATENT DOCUMENTS

| 6,621,316 B1* | 9/2003 | Kirsch ............... H03K 5/135 327/158 |
| 6,924,686 B2 | 8/2005 | Kirsch |
| 8,233,339 B2* | 7/2012 | Yoon ................ G11C 7/22 365/194 |
| 9,054,675 B2* | 6/2015 | Mazumder ............ H03H 11/26 |
| 9,373,376 B2 | 6/2016 | Jung et al. |
| 9,601,170 B1 | 3/2017 | Mazumder |
| 2012/0254873 A1 | 10/2012 | Bringivijayaraghavan |
| 2015/0195108 A1 | 7/2015 | Prokop et al. |

OTHER PUBLICATIONS

International Search Report and Written Opinion in PCT/US2018/028411 dated Aug. 13, 2018.

\* cited by examiner

*Primary Examiner* — Hoai V Ho
*Assistant Examiner* — Minh Dinh
(74) *Attorney, Agent, or Firm* — Fletcher Yoder, P.C.

(57) ABSTRACT

Devices and methods include receiving a command at a command interface to assert on-die termination (ODT) during an operation. An indication of a shift mode register value is received via an input. The shift mode register value corresponds to a number of shifts of a rising edge of the command in a backward direction. A delay pipeline delays the received command the number of shifts in the backward direction to generate a shifted rising edge command signal. Combination circuitry is configured to combine a falling edge command signal with the shifted rising edge command signal to form a transformed command.

20 Claims, 7 Drawing Sheets

DYNAMIC TERMINATION EDGE CONTROL

BACKGROUND

Field of the Present Disclosure

Embodiments of the present disclosure relate generally to the field of semiconductor devices. More specifically, embodiments of the present disclosure relate to dynamic on-die terminations (ODT).

Description of Related Art

A semiconductor device, such as a microcomputer, memory, gate array, among others, may utilize on-die termination (ODT). Activation of the ODT may interfere with some operations (e.g., a memory READ) but may enhance other operations (e.g., a memory WRITE). Thus, the ODT may be dynamically activated using one or more signals, RTT, that is asserted based on various factors. For example, RTT may include one of four types: 1) RTT-PARK a non-command-based that at any time enabled in a mode-register, 2) Dynamic RTT that happens with a WRITE command, 3) WR-Nominal-RTT happens with a non-target WRITE command, and 4) RD-Nominal-RTT happens with a non-target READ command. All of these modes can produce ODT at a data pin (DQ). For a READ operation, all of these types of RTT may be disabled during the read-burst to prevent causing a conflict at the DQ. In some embodiments, there may be a priority list that determines which type of RTT has precedence overall and/or in certain conditions. For example, in some embodiments, RTT-PARK may have a lowest priority while an RTT-OFF (ODT disable) during a READ has the highest priority.

In some embodiments of a memory device, the RTT signal may be asserted to create a dynamic RTT window based on a cas-write-latency (CWL), a cas latency (CL), a burst-length of data, a write preamble, and/or latency-independent. CL is the column access strobe latency that is the delay time between when a memory controller tells the memory module to access a particular memory column and when the data in given array location is available. Moreover, the CWL is a period of time from when a WRITE command is asserted to the input of the first data in a number of clock cycles. However, this timing may be very rigid to prevent the dynamic RTT window from being active during other operations (e.g., READ operation) that may be negatively effected by RTT being active.

Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As is described in detail below, an on-die termination (ODT) may be dynamically asserted during a first operation (e.g., write operation) and deasserted during a second operation (e.g., read operation). However, this ODT termination may be shifted relative to the first operation and a default ODT assertion command (e.g., RTT) to provide timing flexibility or enhance certain implementation aspects. To enable shifts in both forward and backward directions, a delay pipeline may delay a total number of shifts in both directions with a default "unshifted" command being delayed by a maximum number of shifts in the "backward direction." In other words, by delaying the default command, earlier commands are "shifted backwards" relative to the default command. The shifted default commands may be used for their rising or falling edges. Two shifted commands may then be combined to utilize independent rising and falling edges to enable shifting of edges of the ODT assertion command independently. As long as the two shifted commands overlap, a simple OR gate may be used to generate a stretched and shifted command.

Figure 1:
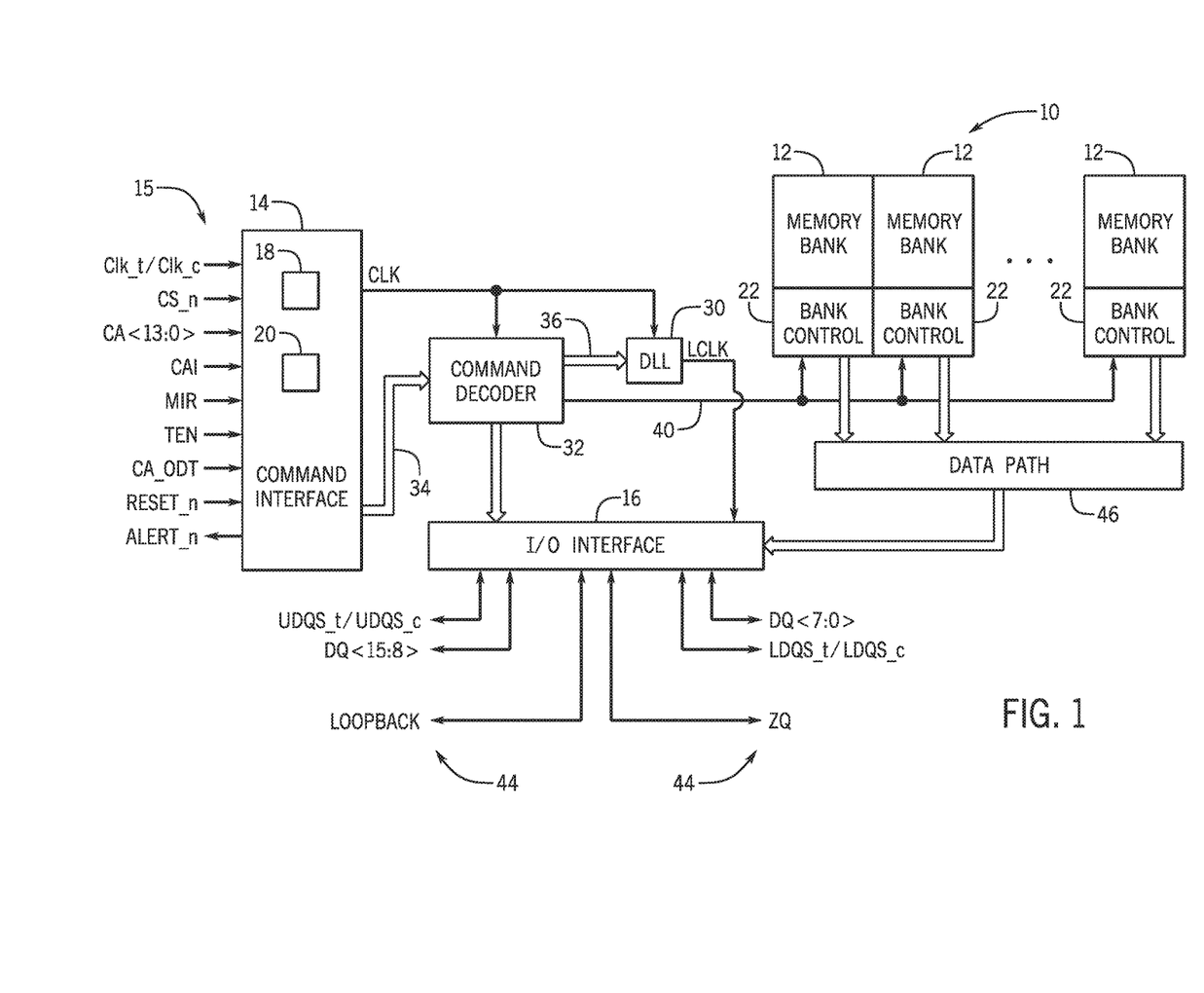
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator, such as a delay locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the IO interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to specific banks 12 within the memory device 10 is encoded on the CA<13:0> bus with the commands.

In addition, the command interface 14 may be configured to receive a number of other command signals. For instance, a command/address on die termination (CA ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the IO interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for a x16 memory device, the IO signals may be divided into upper and lower IO signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/and Clk_c), the data strobe (DQS) signals may be provided as a differential pair of data strobe signals (DQS_t/and DQS_c) to provide differential pair signaling during reads and writes. For certain memory devices, such as a DDR5 SDRAM memory device, the differential pairs of DQS signals may be divided into upper and lower data strobe signals (e.g., UDQS_t/and UDQS_c; LDQS_t/and LDQS_c) corresponding to upper and lower bytes of data sent to and from the memory device 10, for instance.

An impedance (ZQ) calibration signal may also be provided to the memory device 10 through the IO interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the IO interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the IO interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory system 10. Accordingly, it should be understood that the block diagram of FIG. 1 is only provided to highlight certain functional features of the memory device 10 to aid in the subsequent detailed description.

Figure 2:
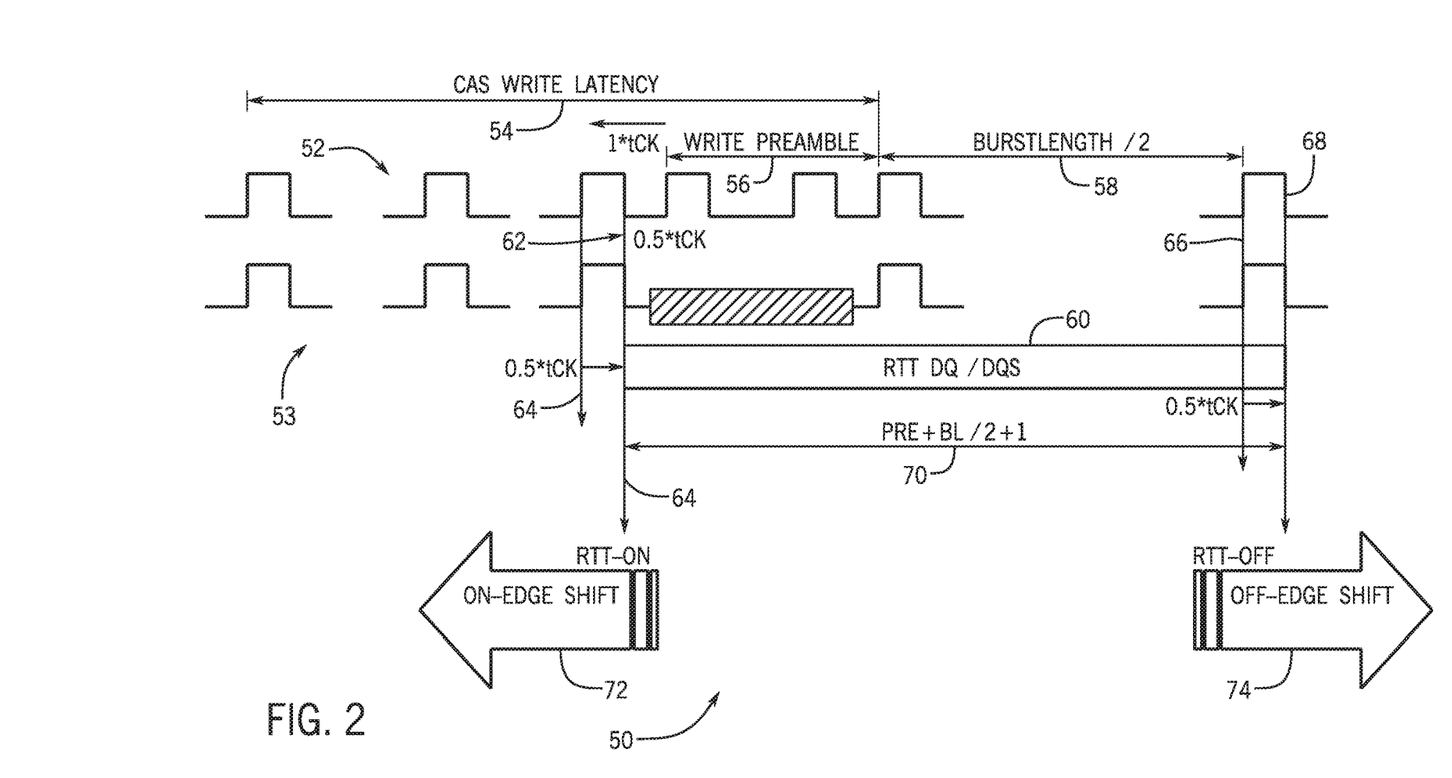
FIG. 2 is a timing diagram of an on-die termination (ODT) command used to provide ODT during certain operations of the memory device of FIG. 1, according to an embodiment of the present disclosure.

FIG. 2 illustrates a timing diagram 50 indicating a relationship between an RTT window and a clock signal 52 and a data strobe (DQS) signal 53. In the system, this DQS signal 53 is used to sample incoming data and can either be aligned to clock signal 52 or may be slightly offset with respect to the clock signal 52 either to the right or to the left. In some embodiments, there are minimum and/or maximum limits for this offset that may be defined as tDQSSmin/max. As previously discussed, a delay occurs between a write command and the first writing of the data. This delay is referred to as the CAS write latency (CWL) 54. The CWL 54 may be defined in the number of clock cycles of the clock signal 52, but the DQS signal 53 is used to "strobe in" the write data. In some embodiments, prior to write data arrival, the DQS signal 53 may behave differently than the clock signal 52. For example, the shape of the DQS signal 53 may appear differently than the pulse train occurring on the clock signal 53. This period may be referred to as a write-preamble that exists on the DQS signal 53. The specific shape may depend on the value on the write-preamble cycles (e.g., 1, 2 or 3). The specific shape, along with CWL information, aids in identifying an exact time of arrival of the write data.

As part of the CWL 54, incoming data to be strobed in as part of the write command may include the write preamble 56. The actual data is written in a write period 58. In the illustrated embodiment, the write period 58 is the burst length divided by two. The write period 58 in this case is the burst length divided by two because the data is being written at a double data rate meaning that the data is strobed on both falling edges and rising edges of DQS signal 53. The burst length is the amount of data that may be written to memory in a single column access (e.g., a length of a prefetch that based on register size and/or number of registers).

As previously discussed, a write operation may be aided by ODT during the write operation that may occur at DQ if an associated RTT is enabled in the corresponding mode register. Specifically, if the mode registers indicate that an appropriate RTT (e.g., RTT-WR) is enabled, dynamic RTT happens with every write command. Similarly, if another RTT mode is set (e.g., RTT-NOM-WR/RTT-NOM-RD), non-target writes and/or reads result in ODT at the DQ. The write operation may be defined as a combination of the write preamble 56 and the write period 58. Accordingly, an RTT period 60 may occur during the write operation. Indeed, to ensure that the write operation is detected properly, the RTT period 60 may extend at least a portion of a clock period (tCK) before and after the write operation. In the illustrated embodiment, a write operation start 62 occurs half of tCK a of the clock signal 52 after a RTT period start 64, and a write operation end 66 occurs half of tCK of the clock signal 52 prior to an RTT period end 68. In other embodiments, the difference between the start/end of the write operation and the start/end of the RTT period 60 may be a whole (or any other portion of a whole) tCK of the clock signal 52. As illustrated, the RTT period 60 may have a length that is equal to a sum of the length of the write preamble 56 and the write period 58 and the clock periods between start/end of the write operation and the start/end of the RTT period 60 (i.e., RTT period 60=preamble+burst length/2+0.5 tCK+0.5 tCK=preamble+burst length/2+1 tCK).

In some embodiments, the RTT period 60 may be expanded by shifting the on-edge (RTT period start 64) or the off-edge (RTT period end 68) to the time that is earlier than the write operation or later than the write operation, respectively. This flexibility in the timing of the RTT period 60, enables a user to more finely tune the timing of memory device to specific applications. The RTT period start 64 and the RTT period end 68 may be shifted independently. In some embodiments, the direction of shift for each of the edges may be limited to a single direction to ensure that the RTT period 60 occurs while the right operation occurs. For example, the RTT period start 64 may only be shifted earlier in time while the RTT period end 68 may only be shifted later in time. In some embodiments, the length of the shift may also be limited to ensure that the RTT period 60 does not extend into an adjacent operation (e.g., read operation, non-target read operation, non-target write operation, etc.) in which ODT may interfere with the read operation. In the following discussion, shifting of the RTT period start 64 and the RTT period end 68 are limited to two clock periods of the clock signal 52. However, in other embodiments, limitations on the shifts may be different based on the edge being shifted and/or may include different shift numbers other than one and two. In some embodiments, the size of the shift may be limited by a maximum number representative mode register to indicate the shift.

Figure 3:
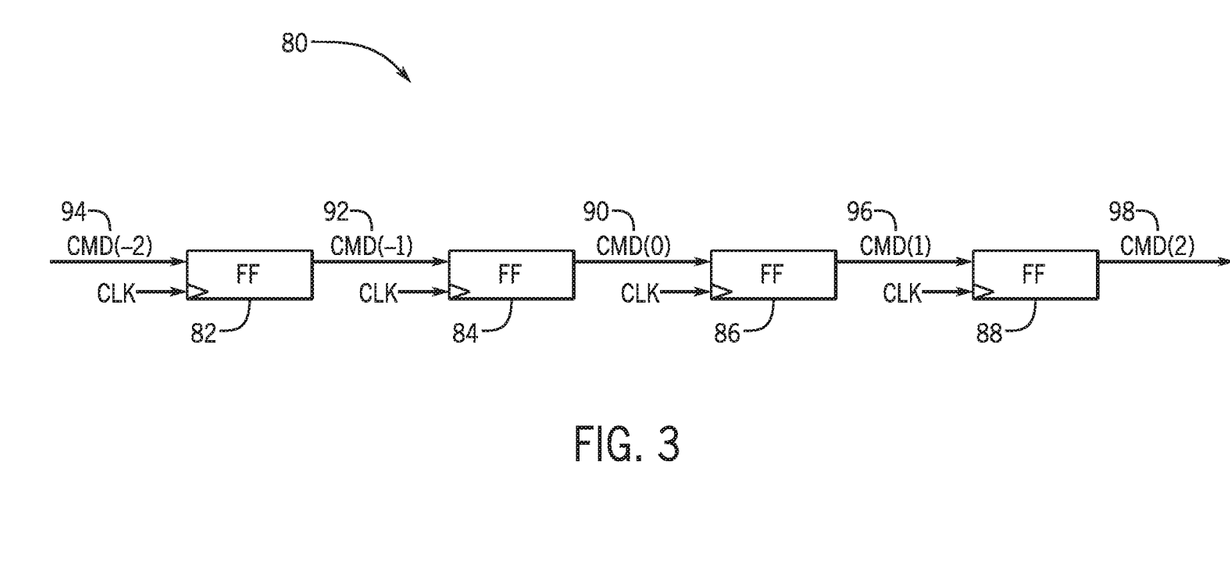
FIG. 3 is a block diagram of a delay pipeline that delays the ODT command to provide available forward or backward shifts of the ODT command, according to an embodiment of the present disclosure.

FIG. 3 illustrates a delay pipeline 80 used to shift edges of the RTT period 60. The delay pipeline 80 may be located in the command interface 14 and/or the I/O interface 16, and/or located as a separate component. The delay pipeline 80 find includes four flip-flops 82, 84, 86, and 88 that delay the command based on a common clock (e.g., clock signal 52). Flip-flops 82 and 84 are used to shift the input command "backward" by delaying the default command 90—CMD (0)—to a maximum number of shifts in the backward direction to ensure that the earliest possible shift occurs a maximum number of clock periods prior to the default command 90. Since the default command 90 is delayed two times, when the command is only delayed once to a single backward shift command 92—CMD(−1)—, it is essentially an earlier shift in time by a single tCK relative to the default command 90. Similarly, when the command is not delayed whatsoever, a double backward shift command 94—CMD (−2)—is essentially a shift earlier in time by two clock periods of the clock relative to the default command 90. The flip-flops 86 and 88 shift the input command in the forward direction to generate a single forward shift command 96—CMD(1)—and a double forward shift command 98—CMD(2). In other embodiments, other numbers flip-flops may be used to generate any number of shifts forward or backward relative to a default command position.

Figure 4:
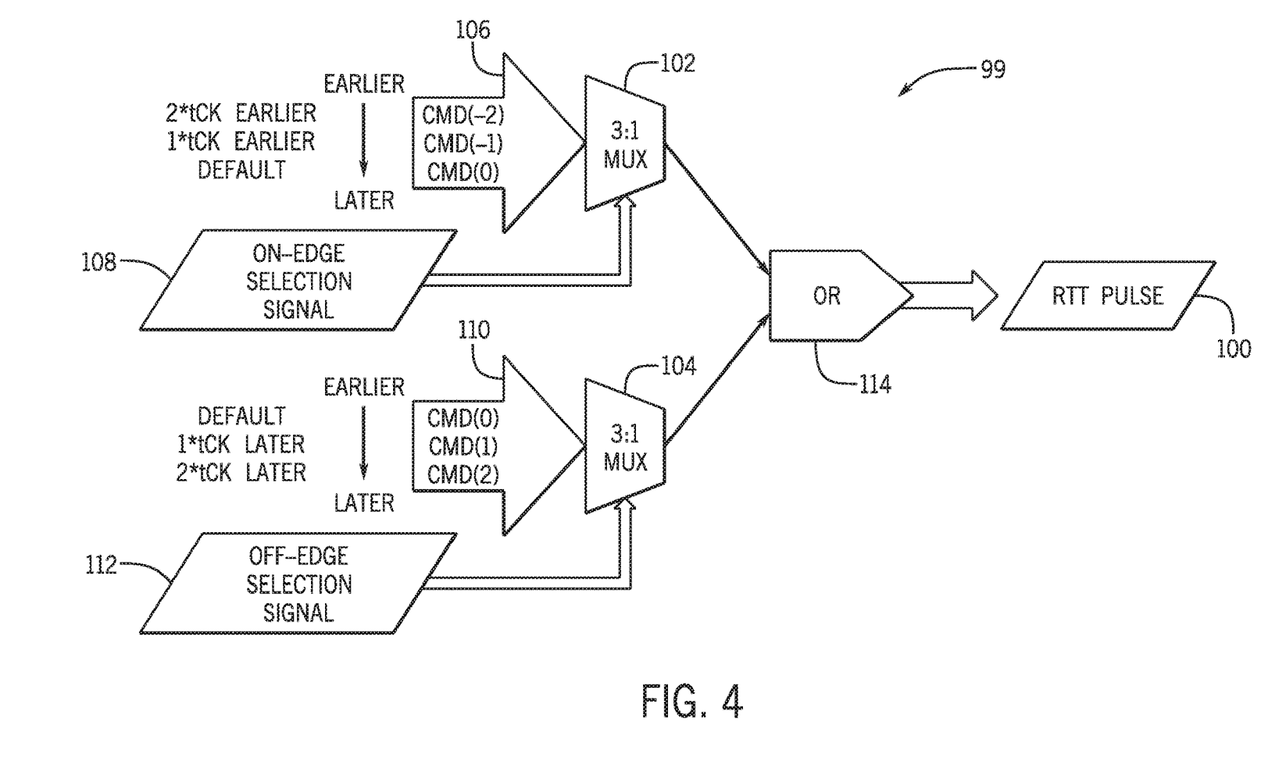
FIG. 4 is a block diagram of selection and combination circuitry that combines shifted ODT commands from the delay pipeline of FIG. 3 to form an output pulse, according to an embodiment of the present disclosure.

FIG. 4 illustrates combination mechanism 99 used to generate an RTT pulse 100 that keeps the RTT period 60 active. Combination mechanism 99 includes a backward-shifting multiplexer 102 and a forward-shifting multiplexer 104. The backward-shifting multiplexer 102 receives all possible shifted commands 106 from the delay pipeline 80 and outputs a command based on an on-edge selection signal 108. The on-edge selection signal 108 may be output from a mode register corresponding to a shift of the on-edge of the RTT pulse 100. Similarly, the forward-shifting multiplexer 104 receives all possible shifted commands 110 from the delay pipeline 80 and outputs a command based on off-edge selection signal 112. The off-edge selection signal 112 may be output from another mode register corresponding to a shift of the off-edge of the RTT pulse 100. Since the output of the multiplexers 102 and 104 are only shifted without stretching, mere usage of these signals alone may cause at least a portion of the write operation to be vulnerable to inaccuracies due to de-assertion of the ODT. However, these outputs may be combined to form a single pulse with an OR gate 114 as long as the outputs overlap to some degree. This overlap may be ensured by limiting an amount of shift to any value less than half of the duration of the input command. Since the relevant portion of the output of the backward-shifting multiplexer 102 is a leading edge of the RTT Pulse 100 and the relevant portion of the output of the forward-shifting multiplexer 104 is a falling edge of the RTT Pulse 100, these two outputs may be combined using an OR gate 114.

Figure 5:
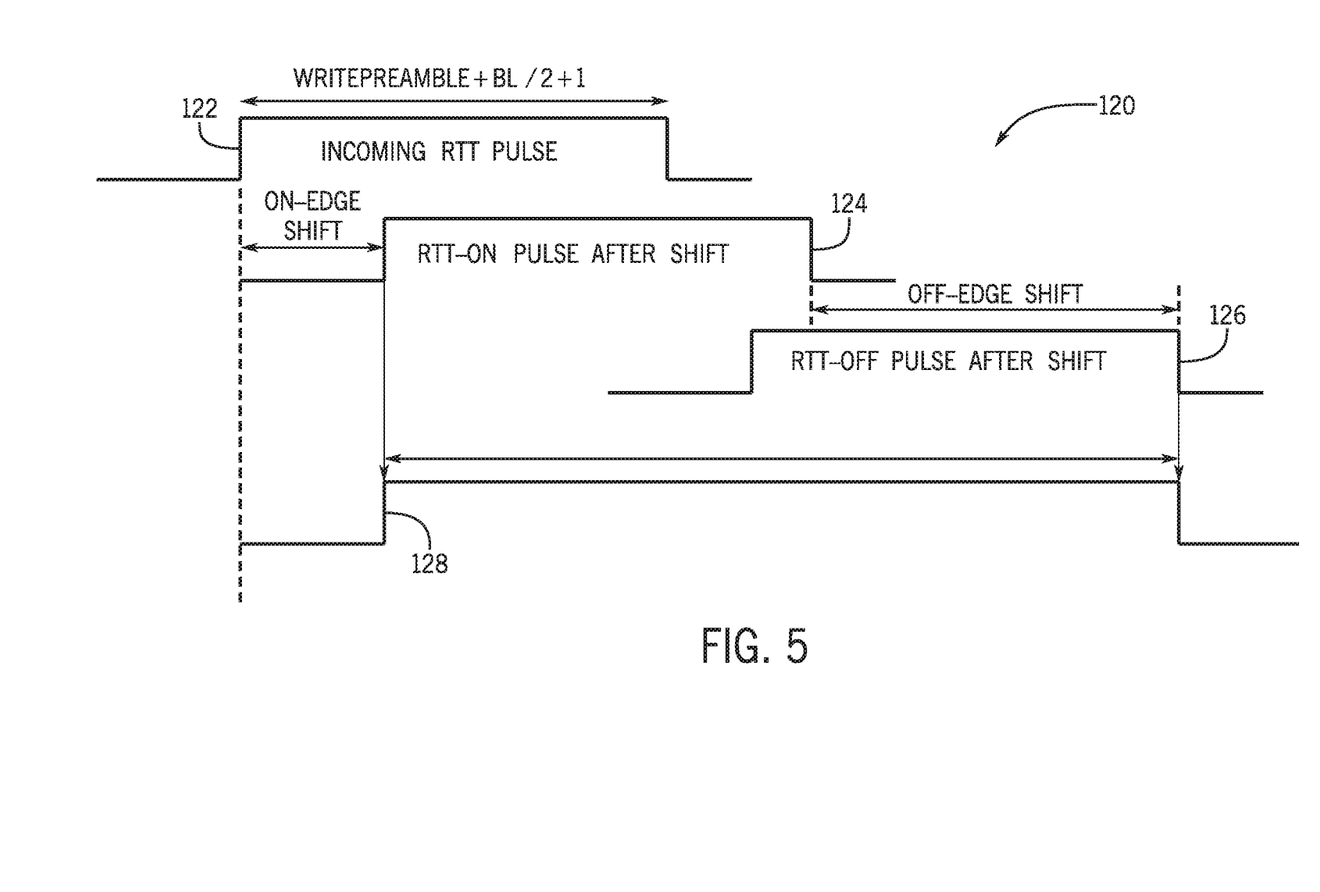
FIG. 5 is a timing diagram of shifted ODT commands combined to form a shifted and stretched ODT command using the selection and combination circuitry of FIG. 4, according to an embodiment of the present disclosure.

FIG. 5 illustrates a timing diagram 120 showing an incoming RTT Pulse having a width of a sum of the widths of the write preamble 56 and the write period 58 (BL/2) and a buffer period in which the incoming RTT Pulse is asserted outside of the write operation. An RTT-ON Pulse after shift 124 is output from the backward-shifting multiplexer 102 with a number of shifts according to the on-edge selection signal 108. An RTT-OFF Pulse after shift 126 is output from the forward-shifting multiplexer 104 with a number of shifts according to the off-edge selection signal 112. The RTT-ON Pulse after shift 124 and the RTT-OFF Pulse after shift 126 are ORed together to produce the RTT Pulse 100.

Figure 6:
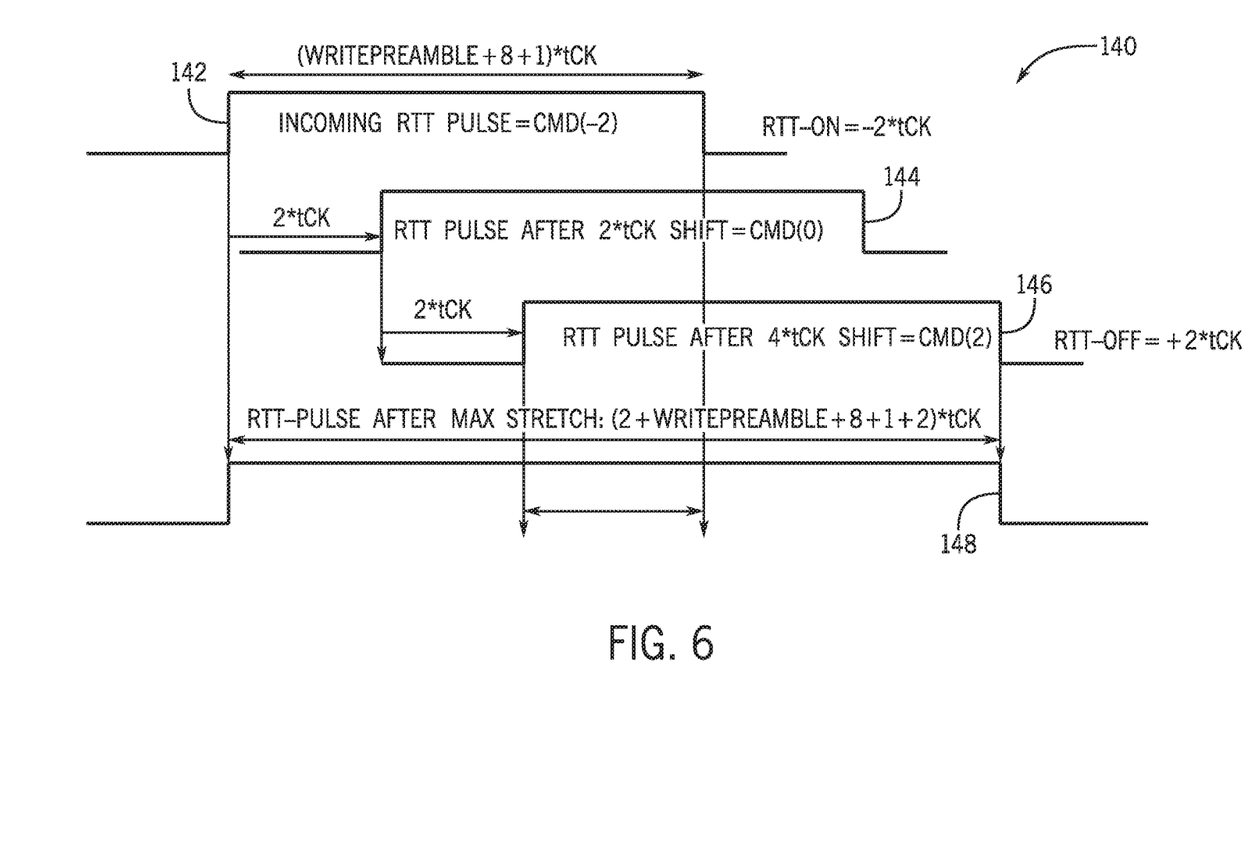
FIG. 6 is a timing diagram of shifted ODT commands combined to form a shifted and stretched ODT command using the selection and combination circuitry of FIG. 4 with example values, according to another embodiment of the present disclosure.

FIG. 6 illustrates an embodiment of a timing diagram 140 that utilizes a 2 tCK shift for the on-edge and the off-edge of the RTT Pulse. The timing diagram 140 illustrates an incoming RTT Pulse 142 that is 2 clock periods earlier through the delay pipeline 80. In the illustrated embodiment, the maximum "backward" shift is two clock periods. Thus, the incoming RTT Pulse 100 is CMD(−2) since the default "unshifted" command 144 is two clock periods later at CMD(0). In other embodiments, the backward shift may be more than two clock periods. In such cases, the incoming RTT Pulse 142 may occur at the maximum number of backward shifts prior to a default "unshifted" command 144. In the illustrated embodiment, RTT-ON is output from the backward-shifting multiplexer 102. When the off-edge of the RTT Pulse 100 is shifted 2 clock periods later, this output is output from the forward-shifting multiplexer 104 as the RTT-OFF Pulse 146. The incoming RTT Pulse 142 (as the −2-shifted RTT Pulse) is ORed with the RTT-OFF Pulse 146 (as the 2-shifted RTT Pulse) to form the RTT Pulse 148 used to activate the RTT period 60 to apply ODT during the write operation.

Note that moving the on edge/off edge while leaving the other edge alone or moving it in the opposite direction amounts to stretching the pulse. Stretching the pulse may also be interpreted as a combined change of latency (RTT window begins earlier) as well as burst-length (RTT window ends later). Accordingly, neighboring commands may be separated out to avoid a conflict of ODT with the DQ when the data is being read in a read (targeted and/or non-targeted) operation chronologically adjacent to the write operation. To address this issue, adjacent operations may include a suitable command separation from write operations in mode registers.

Figure 7:
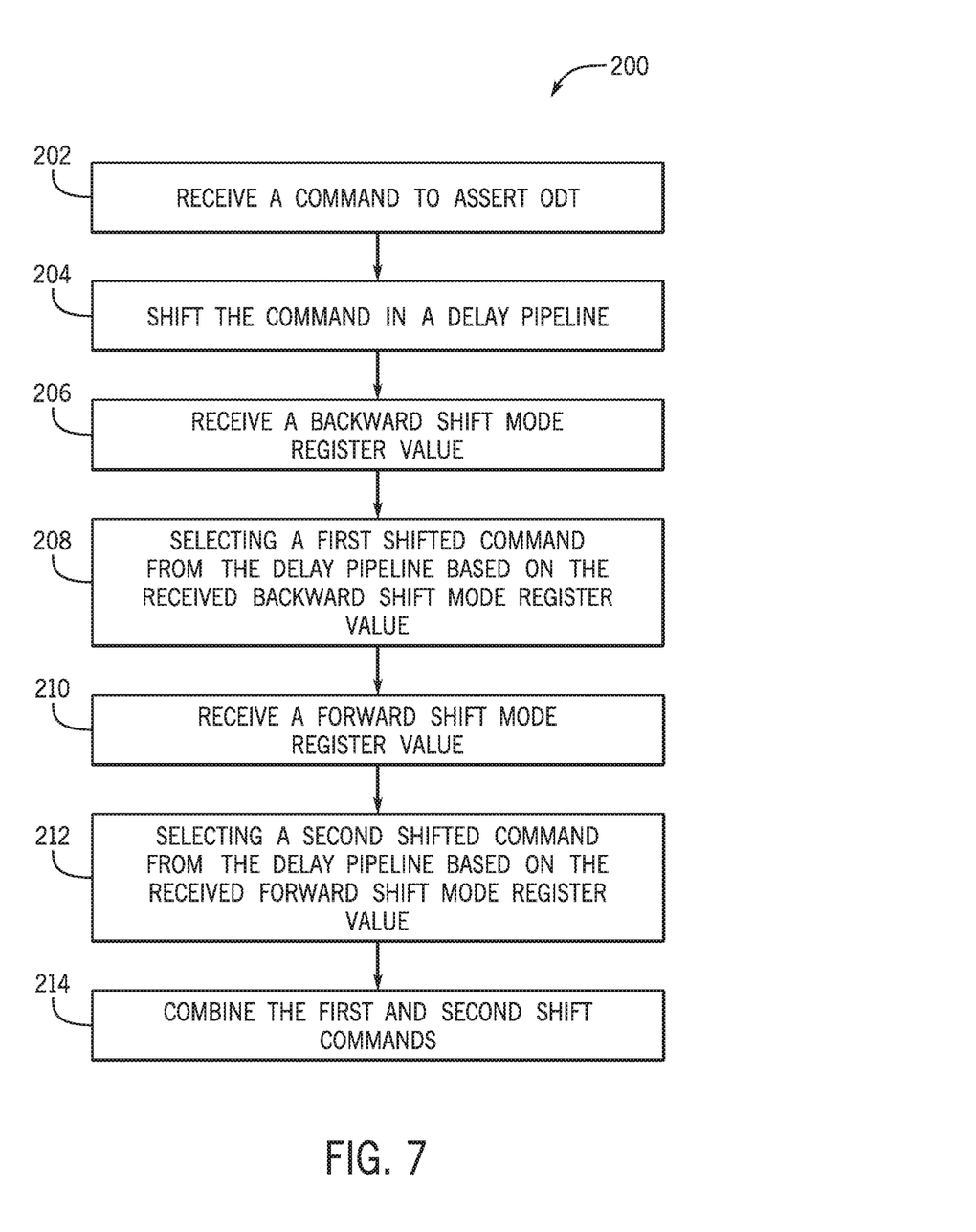
FIG. 7 is a block diagram of a process for shifting and/or stretching an ODT command for a memory device, according to an embodiment of the present disclosure.

FIG. 7 illustrates a flow diagram of a process 200 for shifting and/or stretching an on-die termination (ODT) command. The ODT command may be used to assert ODT during a write operation in a memory device, such as the memory device 10, and may be deasserted during a read operation of the memory device. The process includes receiving a command to ODT on a semiconductor device during an operation (block 202). In some embodiments, the ODT command may be received via the command interface 14 or the I/O interface 16 of the memory device 10.

To improve flexibility of operation of the memory device 10, the ODT command may be shifted and/or stretched. Thus, the process 200 includes shifting the command in a delay pipeline to form a plurality of shifted commands (block 204). Shifting the command includes a "backward" shift that shifts the default location for a command in a forward direction to provide backward shifted commands that have been delayed fewer times than the delayed position for the default command. In other words, by shifting the default command—CMD(0)—to a delayed position, any commands that are delayed fewer times in the delay pipeline than the default command are "shifted backward." Shifting the command also includes shifting forward shifted commands of the plurality of shifted commands in a forward direction relative to the delayed default command.

The process 200 also includes receiving a backward shift mode register value that indicates how far to shift a rising edge of the command using the delay pipeline (block 206). In other words, the rising edge of the command is the area of concern for backward shifts since a backward shift will set the rising edge of the shifted and/or stretched command. Since the delay pipeline provides multiple available backward shifts, selection circuitry (e.g., multiplexer 102) selects a first shifted command of the plurality of shifted commands as a selected rising edge command signal based on the backward shift mode register value (block 208).

The process 200 also includes receiving a forward shift mode register value that indicates how far to shift a falling edge of the command using the delay pipeline (block 210). In other words, the falling edge of the command is the area of concern for forward shifts since a forward shift will set the falling edge of the shifted and/or stretched command. Since the delay pipeline provides multiple available forward shifts, selection circuitry (e.g., multiplexer 104) selects a second shifted command of the plurality of shifted commands as a selected falling edge command signal based on the forward shift mode register value (block 212).

Combination circuitry (e.g., OR gate 114) is used to combine the selected rising edge command signal and the falling edge command signal to form a shifted and stretched command (block 214). A simple OR gate may be used to form the shifted and stretched command if the selected rising edge command signal and the falling edge command signal overlap. Essentially, the OR gate 114 extracts the rising edge from the selected rising edge command signal and extracts the falling edge from the selected falling edge command signal. This stretched and shifted command signal is then output and/or used to control ODT on the memory device 10.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A semiconductor device comprising:
 a command interface configured to receive a command to assert on-die termination (ODT) during an operation;
 an input configured to receive an indication of a shift mode register value that corresponds to a number of shifts of a rising edge of the command in a backward direction;
 a delay pipeline configured to delay the received command the number of shifts in the backward direction to generate a shifted rising edge command signal; and
 combination circuitry configured to combine a falling edge command signal with the shifted rising edge command signal to form a transformed command.

2. The semiconductor device of claim 1, wherein the transformed command comprises a shifted and stretched version of the received command.

3. The semiconductor device of claim 1, comprising an additional input configured to receive an indication of an additional shift mode register value that corresponds to a number of shifts of a falling edge of the command in a forward direction, wherein the delay pipeline is configured to delay the received command the number of shifts in the forward direction.

4. The semiconductor device of claim 1, wherein the combination circuitry comprises an OR gate.

5. The semiconductor device of claim 1, wherein a maximum value for the number of shifts in the backward direction is set by a maximum value representable in a shift mode register holding the shift mode register value.

6. The semiconductor device of claim 1, wherein a maximum value for the number of shifts in the backward direction is limited to prevent interference with an adjacent operation.

7. The semiconductor device of claim 6, wherein the operation comprises a write operation.

8. The semiconductor device of claim 7, wherein the adjacent operation comprises a read operation, a non-target read operation, or a non-target write operation.

9. The semiconductor device of claim 1, wherein the delay pipeline is configured to generate a plurality of backward shifted commands relative to a default command, wherein the default command comprises an unshifted command that is delayed through the delay pipeline by a maximum number of possible shifts in the backward direction to cause the backward shifted commands that are delayed less in the delay pipeline to be backward in time relative to the default command.

10. A semiconductor device comprising:
 a command interface configured to receive a command to assert on-die termination (ODT) during an operation;
 a first input configured to receive an indication of a backward shift mode register value that corresponds to a number of shifts of a rising edge of the command in a backward direction;
 a second input configured to receive an indication of a forward shift mode register value that corresponds to a number of shifts of a falling edge of the command in a forward direction;
 a delay pipeline configured to produce a plurality of shifted commands by delaying the received command a maximum number of shifts in the backward direction to generate a plurality of rising edge command signals and a maximum number of shifts in the forward direction to generate a plurality of falling edge command signals;
 selection circuitry to select a selected rising edge command signal based on the first input and to select a selected falling edge command signal based on the second input; and combination circuitry to combine the selected rising edge command signal with the selected falling edge command signal to form a transformed command.

11. The semiconductor device of claim 10, wherein the transformed command comprises a shifted and stretched version of the received command.

12. The semiconductor device of claim 10, wherein the selection circuitry is configured to select, as the selected rising edge command signal or the selected falling edge command signal, an unshifted command that has been shifted by the maximum number of shifts in the forward direction based on the first input.

13. The semiconductor device of claim 10, wherein the combination circuitry comprises an OR gate configured to combine the selected rising edge command signal with selected falling edge command signal.

14. The semiconductor device of claim 10, wherein the delay pipeline comprises a plurality of flip-flops that are connected to a common clock.

15. The semiconductor device of claim 10, wherein the maximum number of shifts in the forward direction is the same as the maximum number of shifts in the backward direction.

16. The semiconductor device of claim 10, wherein a default unshifted command is delayed in the delay pipeline by a maximum number of shifts in the backward direction.

17. A method, comprising:
receiving a command to assert on-die termination (ODT) on a semiconductor device during an operation;
shifting the command in a delay pipeline to form a plurality of shifted commands, wherein shifting the command comprises:
shifting the command in a backward direction by delaying a default command to cause backward shifted commands of the plurality of shifted commands to be shifted backward relative to the delayed default command by shifting the backward shifted commands through the delay pipeline by a fewer number of delays to occur earlier than the default command; and
shifting forward shifted commands of the plurality of shifted commands in a forward direction relative to the delayed default command;
receiving a backward shift mode register value indicating how far to shift a rising edge of the command in the backward direction using the delay pipeline;
selecting a first shifted command of the plurality of shifted commands as a selected rising edge command signal based on the backward shift mode register value;
receiving a forward shift mode register value indicating how far to shift a falling edge of the command in the forward direction using the delay pipeline;
selecting a second shifted command of the plurality of shifted commands as a selected falling edge command signal based on the forward shift mode register value; and
combining the selected rising edge command signal and the selected falling edge command signal to form a shifted and stretched command.

18. The method of claim 17, wherein shifting the command comprises delaying the command by a delay number that is equal to a maximum number of shifts in the forward direction and a maximum number of shifts in the backward direction.

19. The method of claim 18, wherein shifting the command comprises delaying the command using the delay number of flip flops.

20. The method of claim 19, wherein the plurality of shifted commands comprises the delay number of shifted commands plus one.

* * * * *